(12) United States Patent
Yang (10) Patent No.: US 10,854,616 B2
(45) Date of Patent: Dec. 1, 2020

(54) SEMICONDUCTOR STRUCTURE AND METHOD FORMING THE SAME

(71) Applicant: MACRONIX International Co., Ltd., Hsinchu (TW)

(72) Inventor: Chin-Cheng Yang, Kaohsiung (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 17 days.

(21) Appl. No.: 16/391,130

(22) Filed: Apr. 22, 2019

(65) Prior Publication Data

US 2020/0335509 A1 Oct. 22, 2020

(51) Int. Cl.
*H01L 27/115* (2017.01)
*H01L 23/544* (2006.01)
*H01L 21/66* (2006.01)
*H01L 21/311* (2006.01)

(52) U.S. Cl.
CPC .......... *H01L 27/115* (2013.01); *H01L 23/544* (2013.01); *H01L 21/31105* (2013.01); *H01L 22/20* (2013.01)

(58) Field of Classification Search
CPC ................. H01L 27/115; H01L 23/544; H01L 21/31105; H01L 22/20
USPC .......................................................... 257/329
See application file for complete search history.

(56) References Cited

U.S. PATENT DOCUMENTS

2019/0393236 A1* 12/2019 Kaneko ............. H01L 27/11524
2020/0194447 A1* 6/2020 Sun .................... H01L 27/11582

FOREIGN PATENT DOCUMENTS

TW 201824480 7/2018

OTHER PUBLICATIONS

"Office Action of Taiwan Counterpart Application," dated Nov. 29, 2019, p. 1-p. 6.

* cited by examiner

*Primary Examiner* — Karen Kusumakar
*Assistant Examiner* — Adam S Bowen
(74) *Attorney, Agent, or Firm* — J.C. Patents (57) ABSTRACT

Reference marks for forming a staircase structure are disposed along slit areas of a 3D memory structure, and slits of the 3D memory structure are formed on the slit areas. In a staircase area, the reference marks are formed by etching the topmost one of stacked layers, having a pair of a dielectric layer and a sacrificial layer, in a stacked structure.

19 Claims, 14 Drawing Sheets

SEMICONDUCTOR STRUCTURE AND METHOD FORMING THE SAME

BACKGROUND

1. Field of the Invention

This disclosure is related to high density integrated circuit devices, especially related to a method for aligning a series of etching masks and a semiconductor structure used therein.

2. Description of Related Art

In the manufacturing of memory devices, how to form a series of large photoresist patterns can be challenging, since the two opposite boundaries of the large photoresist patterns cannot be observed under an in-line SEM (scanning electron microscope) at the same time. That is, only one of the two opposite boundaries of the large photoresist patterns can be observed under an in-line SEM. Therefore, it is difficult to directly measure the dimensions and positions of the large photoresist patterns and adjust the parameters of forming photoresist patterns accordingly. Hence, when such photoresist patterns having large dimensions must be measured, the manufacturer may need to remove the wafer from the manufacturing line and use specialized equipment.

SUMMARY

In one aspect, a method of forming a semiconductor structure is provided. In this method, photoresist patterns with large dimensions are used.

This method including the following steps. A stacked structure including stacked layers having a pair of a dielectric layer and a sacrificial layer is formed on a substrate having an array area and a staircase area. The sacrificial layer is under the dielectric layer in each of the stacked layers. Reference marks are formed in a topmost one of the stacked layers respectively at the target positions along slit areas predetermined for forming slits, and the reference marks are formed by etching a topmost one of the stacked layers. A first etch-trim cycle is performed next.

The first etch-trim cycle above includes the following steps. A first photoresist pattern is formed on the substrate, wherein an outermost reference mark is exposed by the first photoresist pattern. The topmost one of the stacked layers, which are exposed by the first photoresist pattern, is etched. The first photoresist pattern is trimmed to retreat the boundary of the first photoresist pattern back for a predetermined distance or expose the reference mark next to the previously exposed reference mark. The etching step and the trimming step are repeated for several times to form stairs. The remained part of the first photoresist pattern is removed.

Then, slits are formed by etching the stacked structure on the slit areas until the substrate is exposed.

In some embodiments, the width of the reference marks is larger than the width of the slits.

In some other embodiments, the slits have a first width in the array area and a second width in the staircase area, and the first width is narrower than the second width.

In yet some other embodiments, a second etch-trim cycle is further performed. In the second etch-trim cycle, a second photoresist pattern is formed on the substrate, and the reference mark next to the previously exposed reference mark is exposed by the second photoresist pattern. The topmost one of the stacked layers, which are exposed by the second photoresist pattern, is etched. The second photoresist pattern is trimmed to retreat the boundary of the second photoresist pattern back for the predetermined distance or expose the reference mark next to the previously exposed reference mark. The etching step and the trimming step are repeated for several times. The remained second photoresist pattern is then removed.

In some other embodiments, vertical channel pillars are further formed in the stacked structure before forming the slits.

In yet some other embodiments, the sacrificial layers, exposed by the slits, of the stacked structure, are removed to form interspaces between adjacent layers of the dielectric layers, and conductive layers are formed in the interspaces left by the sacrificial layers.

In yet some other embodiments, insulating liners and conductive plugs are further sequentially formed respectively in the slits after forming the conductive layers.

In yet some other embodiments, word line contacts are further formed to connect the topmost conductive layers of each stair in the staircase structure.

In another aspect, a semiconductor structure is provided. In this semiconductor structure, a stacked structure including stacked layers having a pair of a dielectric layer and a conductive layer on a substrate having an array area and a staircase area. The conductive layer is under the dielectric layer in each of the stacked layers, and the stacked structure has a staircase structure on the staircase area. Slits are disposed in the stacked structure to expose the substrate, and the slits are disposed across the array area and the staircase area. Reference marks are disposed along at least one side of the slits in the staircase structure.

In some embodiments, the reference marks are openings disposed in the topmost one of the stacked layers.

In some other embodiments, the reference marks are disposed on each stair of the staircase structure.

In yet some other embodiments, the reference marks are disposed on each area between adjacent two of the slits in the staircase structure.

In yet another aspect, another semiconductor structure is provided. In this semiconductor structure, a stacked structure including stacked layers having a pair of a dielectric layer and a conductive layer on a substrate having an array area and a staircase area. The conductive layer is under the dielectric layer in each of the stacked layers, and the stacked structure has a staircase structure on the staircase area. Slits are disposed in the stacked structure to expose the substrate. The slits have a first width in the array area and have a second width in the staircase area, and the first width is narrower than the second width.

In the semiconductor structures above, some other features may be further included. Vertical channel pillars are further disposed in the stacked structure. Word line contacts are respectively disposed on each stair of the staircase structure to respectively connect the topmost conductive layers of the stairs. An insulating liner and a conductive plug on the insulating liner are respectively disposed in each of the slits.

Since the reference marks are formed before the photoresist patterns with large dimensions are formed, even though only one of the opposite boundaries of the large photoresist patterns can be observed under an in-line SEM, the positions and dimensions of the large photoresist patterns still can be measured to determine any adjustments of the process parameters are needed or not.

Moreover, since the reference marks are formed on the slit areas, the width of the slits in the staircase area may be chosen to be wider or narrower than the width of the reference marks. If the width of the slits is narrower than the width of the reference marks, the reference marks can be left along at least one side of the slits to serve for any other possible purposes. If the width of the slits is wider than the width of the reference marks, the reference marks can be completely removed without a trace.

DESCRIPTION OF THE EMBODIMENTS

Reference is made to the following examples and accompanying drawings for a more complete understanding of the invention, but the invention may be practiced in many different forms and should not be construed as limited to the embodiments set forth herein. For ease of understanding, the same elements in the following description will be denoted by the same reference numerals. In the drawings, for the sake of clarity, the components and their relative sizes may not be drawn to scale.

An important part of 3D NAND memory is how to access the word lines. This is done by a characteristic staircase structure that exposes each word line and allows electrical connections to be formed to connect each stair of the staircase structure. During a process of forming a staircase structure, several photoresist patterns, used as etching masks and having different sizes, are usually used one after the other, since the limited height of the photoresist patterns. Several etch-trim cycles of the process are repeatedly performed to form stairs of the staircase structure; hence the height of the photoresist pattern is continuously reduced. Once the height of the photoresist pattern is insufficient to be used in the subsequent etching process, the photoresist pattern has to be removed, and a new photoresist pattern with a dimension either larger or smaller is formed instead according to the requirement of the process.

Figure 1:
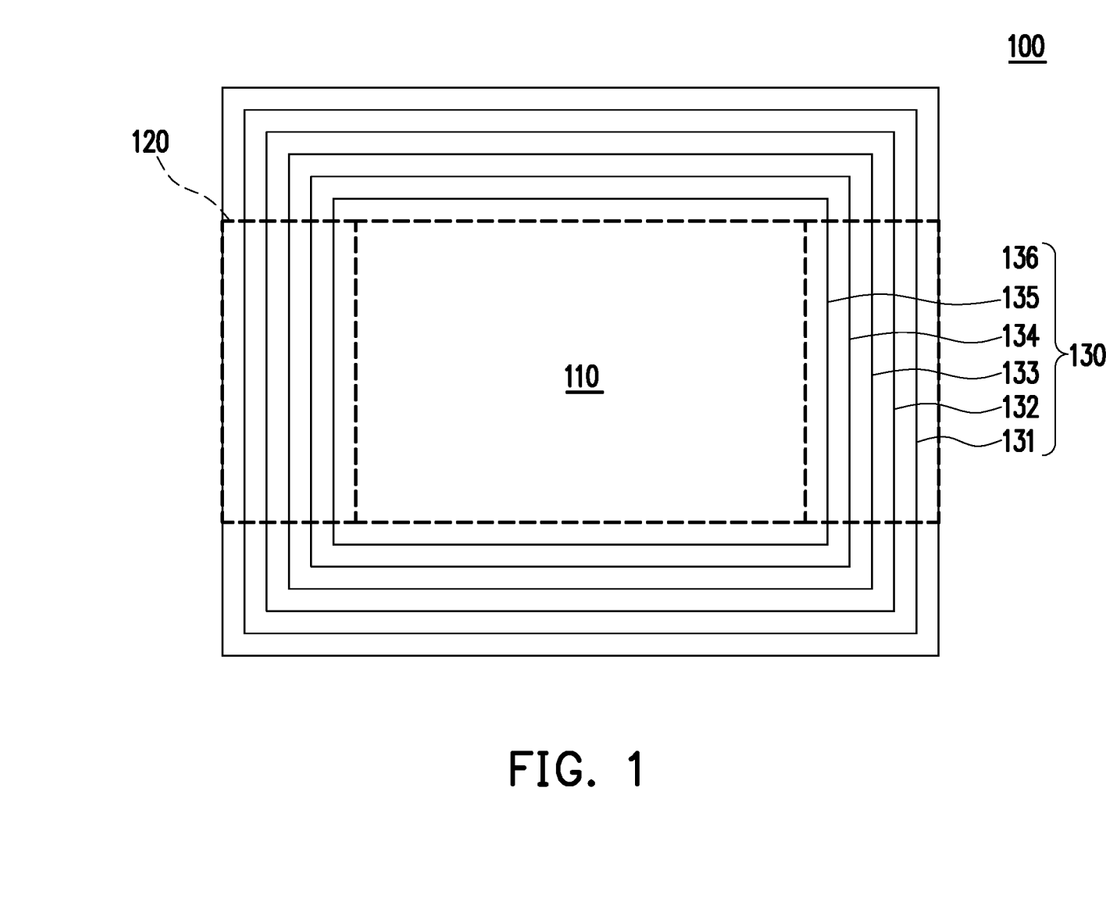
FIG. 1 is a diagram showing a top view of multiple photoresist patterns used for a staircase structure of a 3D memory.

FIG. 1 is a diagram showing a top view of multiple photoresist patterns used for a staircase structure of a 3D memory. In FIG. 1, an array area 110 is disposed on the center of the die 100, and a staircase area 120 are usually disposed on any two opposite sides of the array area 110, such as right and left sides of the array area 110 in FIG. 1. Several photoresist patterns 130 (such as photoresist patterns 131-136 shown in FIG. 1) are needed to complete the process of forming the staircase structure. Each of the photoresist patterns 130 completely covers the array area 110. Since the large dimension of the array area 110 and thus the photoresist patterns 130, the two opposite boundaries of the photoresist patterns 130 cannot be observed under an in-line SEM to obtain the positions and dimensions of the photoresist patterns 130. Thus, any subsequent parameters adjustments and controls are difficult to be performed.

Figure 2A:
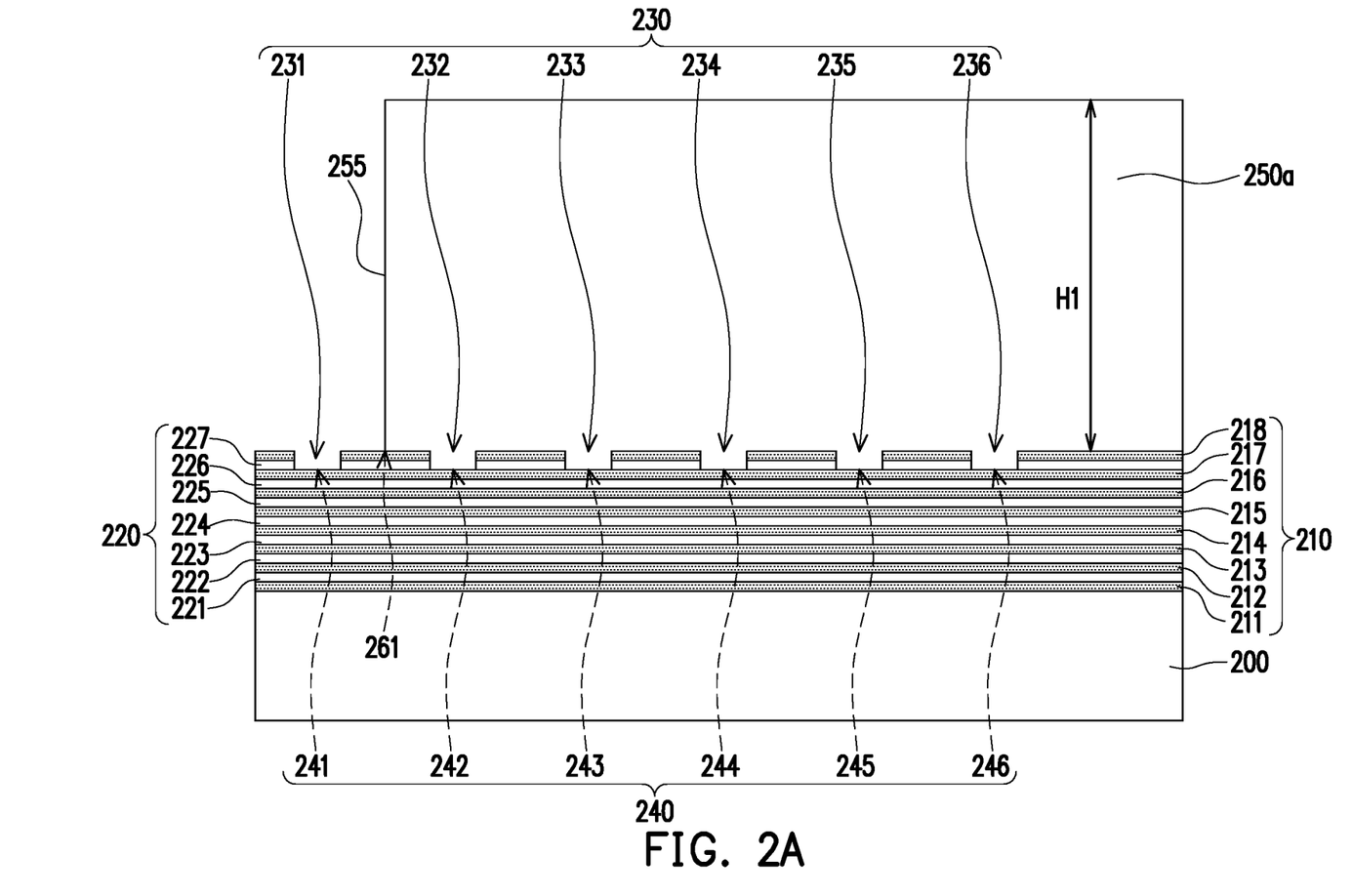
FIGS. 2A-2F are simplified cross-sectional structures of an etch-trim process for forming stairs of a staircase structure of a 3D memory according to some embodiments of this invention.

FIGS. 2A-2F are simplified cross-sectional structures of an etch-trim process for forming stairs of a staircase structure of a 3D memory according to an embodiment of this invention. In FIG. 2A, a stacked structure having multiple dielectric layers 210 (such as dielectric layers 211-218 shown in FIG. 2A) and multiple sacrificial layers 220 (such as sacrificial layers 221-227 shown in FIG. 2A) alternatively stacked is formed on a substrate 200. A pair of one dielectric layer 210 and one underlying sacrificial layer 220 constitute a stacked layer. The thickness of the dielectric layers 210 is generally thinner than the thickness of the sacrificial layers 220. The thickness of the dielectric layers 210 may be 250-350 Å, such as about 300 Å. The thickness of the sacrificial layer 220 may be 300-500 Å, such as 400 Å. The material of the dielectric layers 210 may be silicon oxide, and the material of the sacrificial layers 220 may be silicon nitride.

Then, multiple reference marks 230 (such as reference marks 231-236 shown in FIG. 2A) are formed by etching the topmost pair of the dielectric layer 210 (such as the dielectric layer 218 in FIG. 2A) and the sacrificial layer 220 (such as the sacrificial layer 227 in FIG. 2A) respectively to form openings in the topmost pair of the dielectric layer 210 and the sacrificial layers 220 at the target positions 240 (such as target positions 241-246 shown in FIG. 2A). Therefore, the reference marks 230 are located in the topmost pair of the dielectric layer 210 (such as the dielectric layer 218 in FIG. 2A) and the sacrificial layer 220 (such as the sacrificial layer 227 in FIG. 2A).

Next, a first photoresist pattern 250a having a first height H1 is formed to have a boundary 255 positioned at a first position 261 between the reference marks 231 and 232, such as the middle between the reference marks 231 and 232. The forming method of the first photoresist pattern 250a includes spin coating a photoresist material on the substrate 200 and then performing a photolithography process to the photoresist material.

Figure 2B:
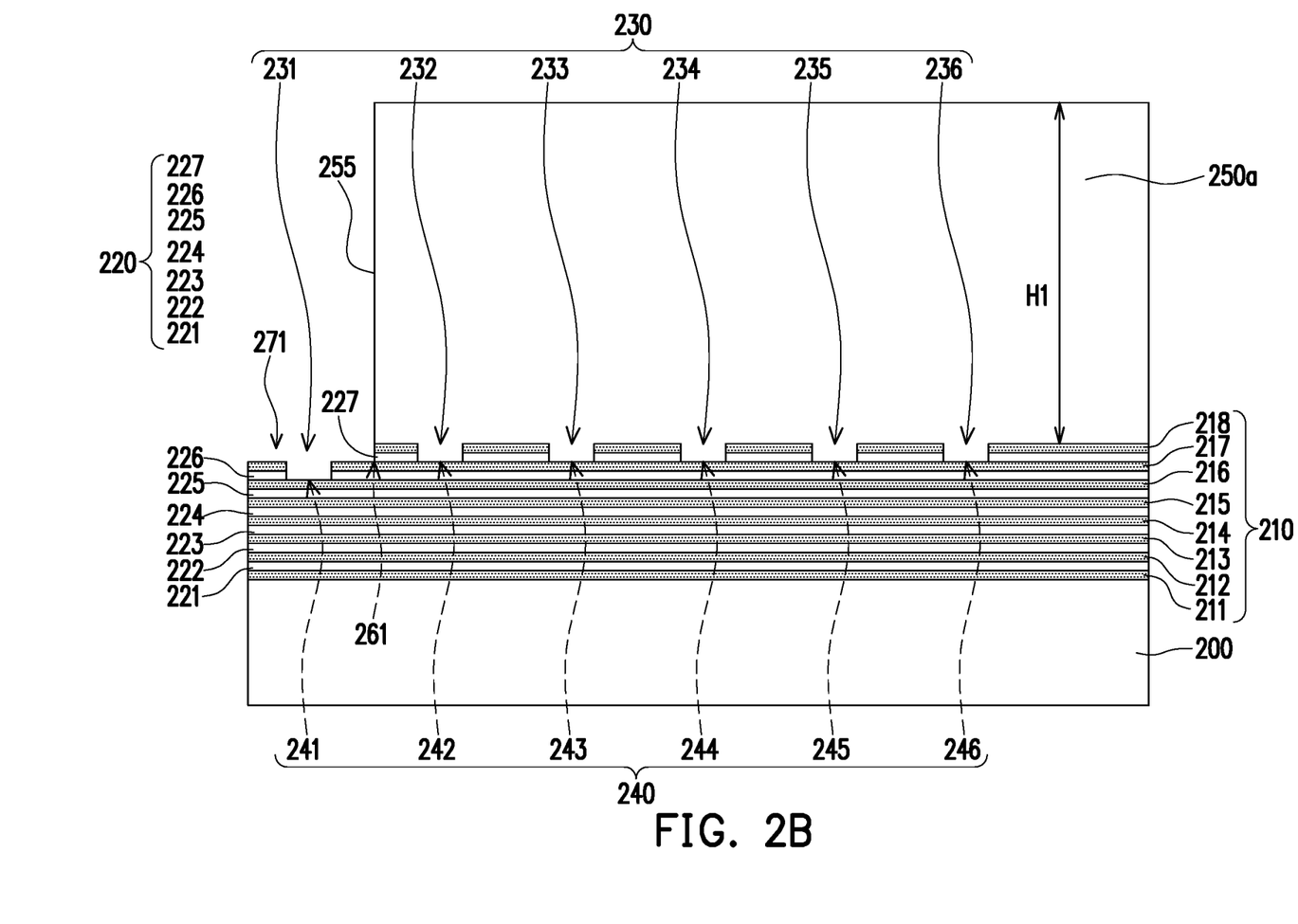

In FIG. 2B, at least the topmost pair of the dielectric layer 210 and the sacrificial layer 220, which is exposed (or not covered) by the first photoresist pattern 250a, are etched. The exposed topmost pair of dielectric layer 217 and the underlying sacrificial layer 226 are sequentially etched to form a first stair 271. In the reference mark 231, the top layer is the dielectric layer 217. Hence, the exposed dielectric layer 217 and the underlying sacrificial layer 226 in the reference mark 231 are also etched at the same time with the dielectric layer 218 and the sacrificial layer 227 outside the reference mark 231. Therefore, the reference mark 231 are declined into the next pair of the dielectric layer 217 and the underlying sacrificial layer 226. The rest of the reference marks 232-236 are covered by the first photoresist pattern 250a, and thus are not affected.

Figure 2C:
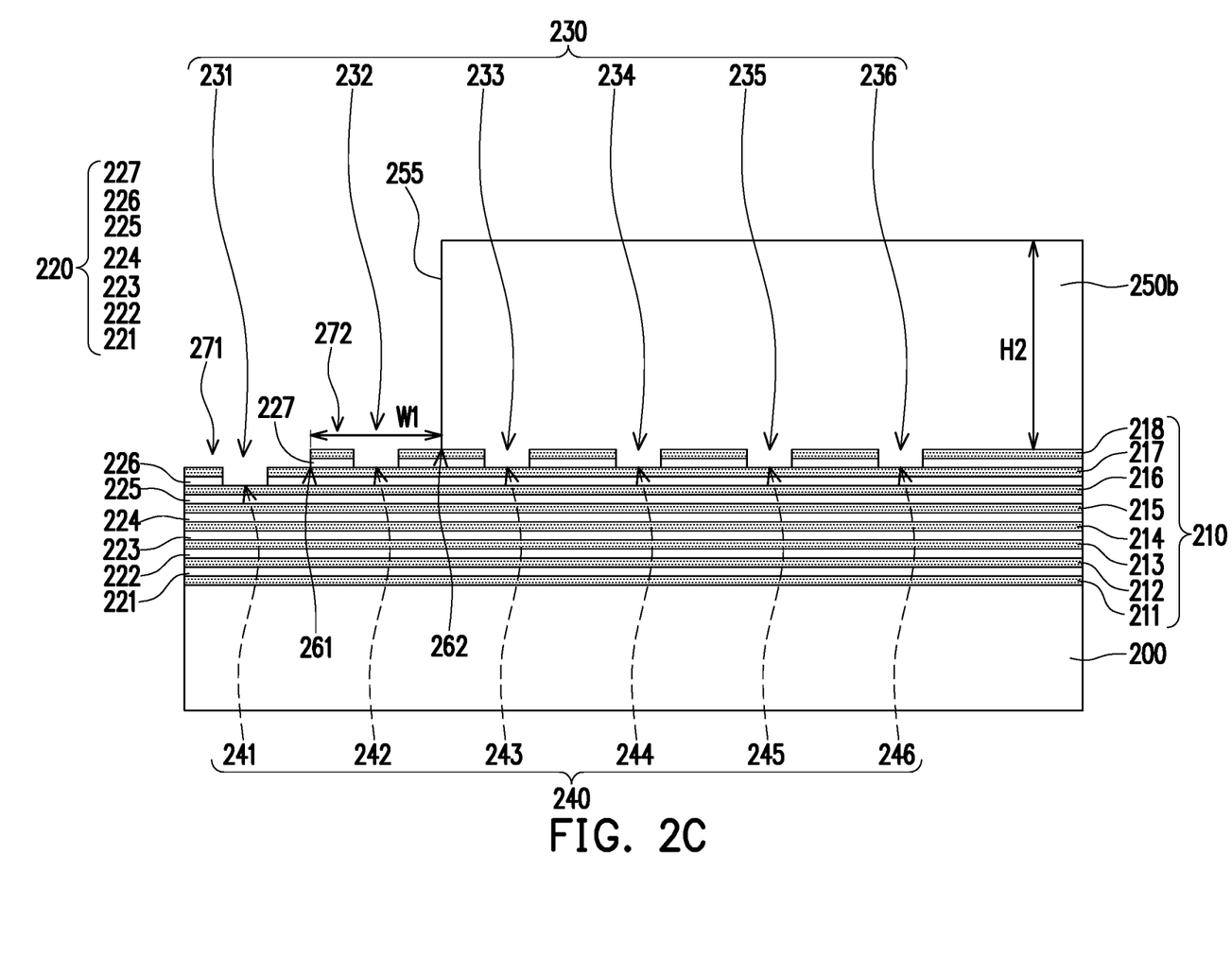

In FIG. 2C, a photoresist trimming process is performed. The first photoresist pattern 250a is trimmed by isotropically etching to retreat the boundary 255 from the first position 261 back to a second position 262 between the reference marks 232 and 233, such as the middle between the reference marks 232 and 233, and reduce the height from the first height H1 to a second height H2, and a second photoresist pattern 250b is thus obtained. The distance between the first position 261 and the second position 262 is a first stair width W1.

Figure 2D:
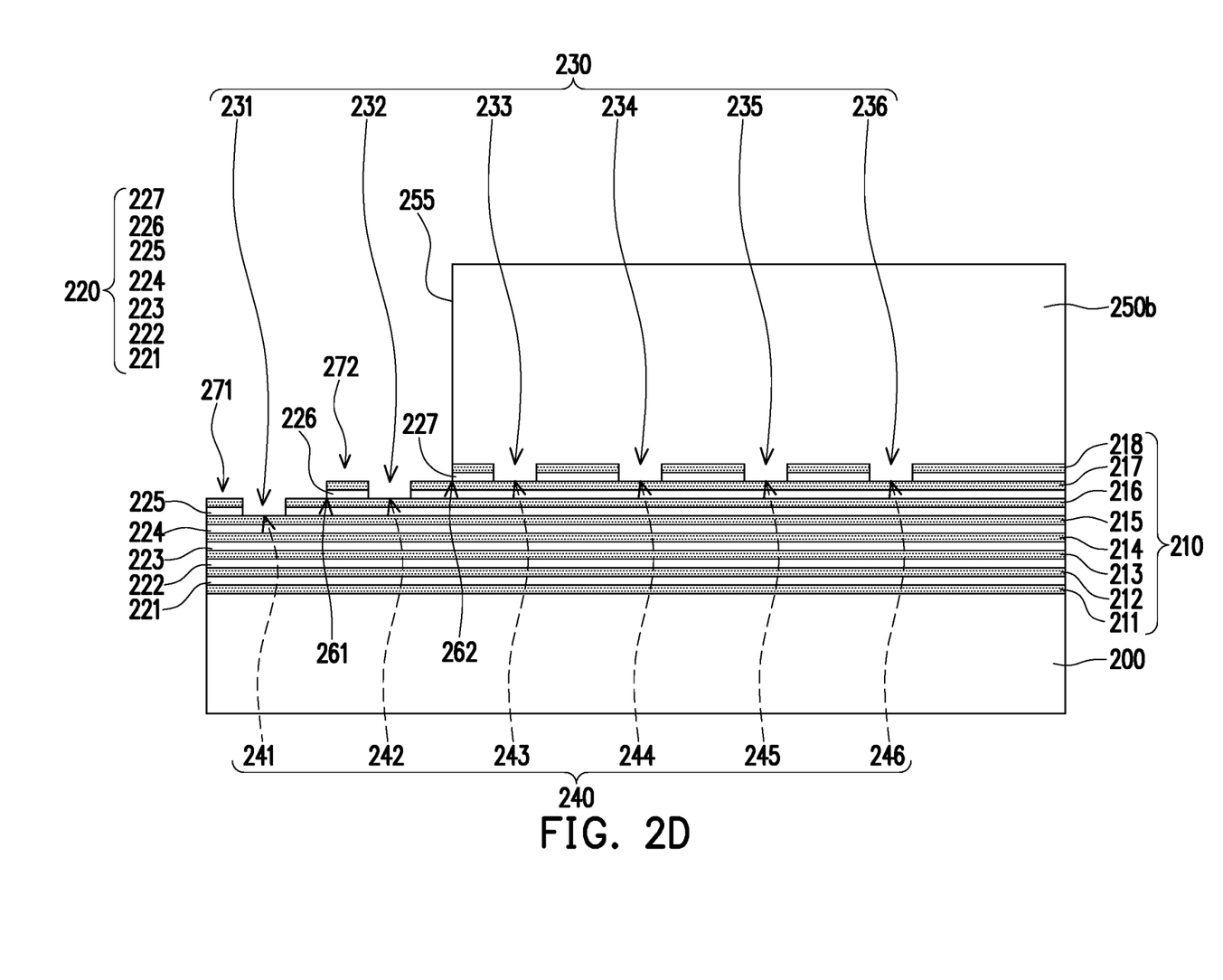

In FIG. 2D, the etching process performed in FIG. 2B is repeated again, and the details are thus omitted here. Accordingly, the exposed dielectric layer 210 and the underlying sacrificial layer 220 are etched again to form a second stair 272 to have the first stair width W1. At the same time, the exposed reference mark 231 in the first stair 271 and the exposed reference mark 232 in the second stair 272 are both declined into the pair of the dielectric layer 216 and the underlying sacrificial layer 225 as well as the pair of the dielectric layer 217 and the underlying sacrificial layer 226, respectively.

Figure 2E:
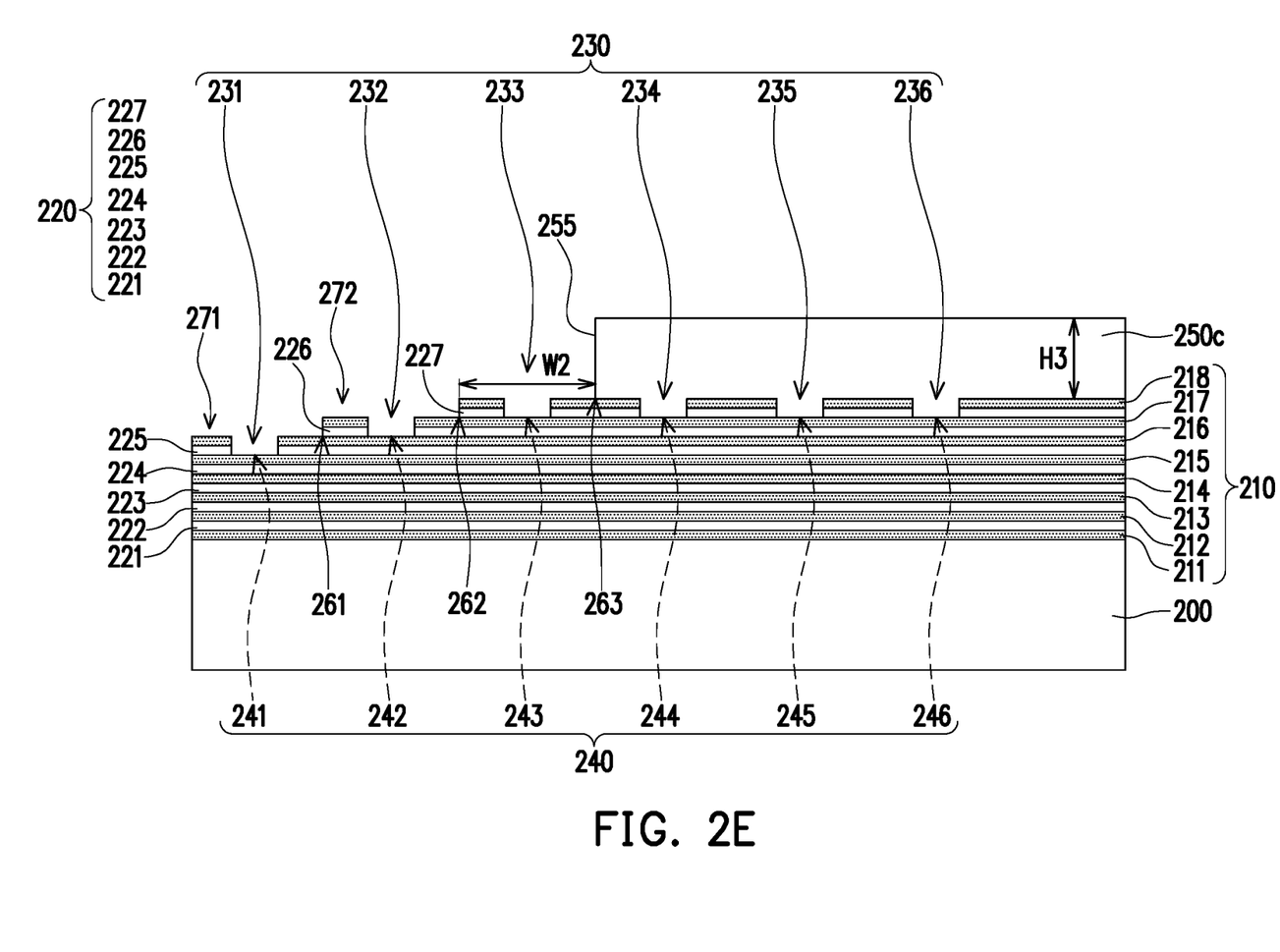

In FIG. 2E, the trimming process performed in FIG. 2C is repeated again, and the details are thus omitted here. Hence, the boundary 255 of the second photoresist pattern 250b is retreated back to a third position 263 between the reference marks 233 and 234, and the second height H2 of the second photoresist pattern 250b is reduced to a third height H3 to obtain a third photoresist pattern 250c. The distance between the second position 262 and the third position 263 is a second stair width W2. The second stair width W2 may be the same as or different from the first stair width W1, according to the demand of the staircase structure design.

Figure 2F:
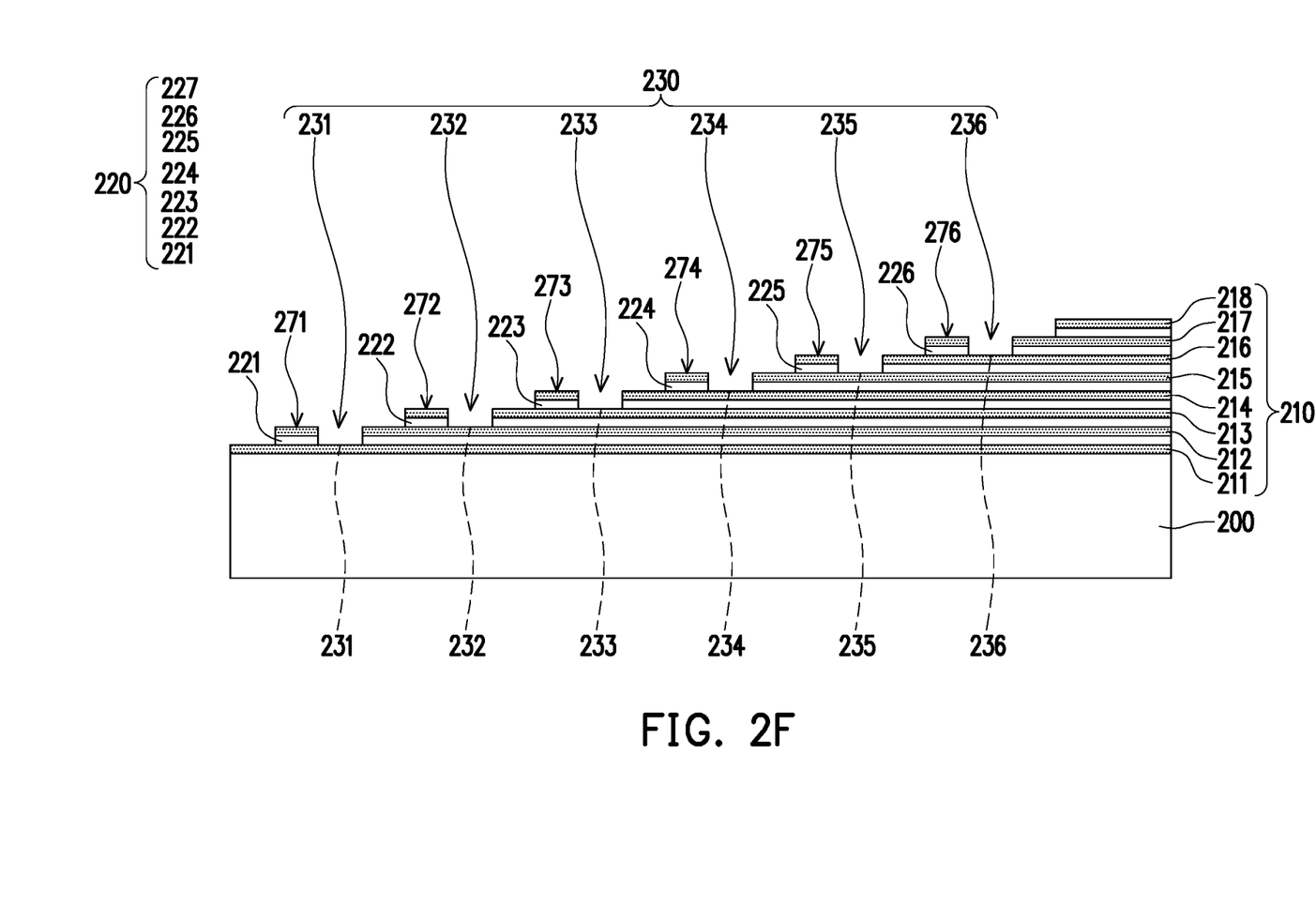

Next, the etching process in FIG. 2B and the trimming process in FIG. 2C are repeated for several times. For example, when the remained height of the photoresist pattern is insufficient to be used as an etching mask, and then the remained photoresist pattern may be removed, and another novel photoresist pattern is formed again to repeat the etching process in FIG. 2B and the trimming process in FIG. 2C until the designed or required stairs are completely formed. A possible obtained structure is shown in FIG. 2F. In FIG. 2F, it can be seen that each of the reference marks 231-236 are respectively located in the first stair 271 to the sixth stair 276. Therefore, the position of the initial photoresist pattern and the dimension of the photoresist patterns at various stages can be monitored.

To avoid interference with existing designs and processes of the 3D memory, the reference marks above may be disposed on slit areas, which are predetermined to form slits across the array area and the staircase area of a 3D memory. Therefore, according to some embodiments of this invention, a process flow of a 3D memory for integrating the process of forming the reference marks is shown in FIG. 2G.

Figure 2G:
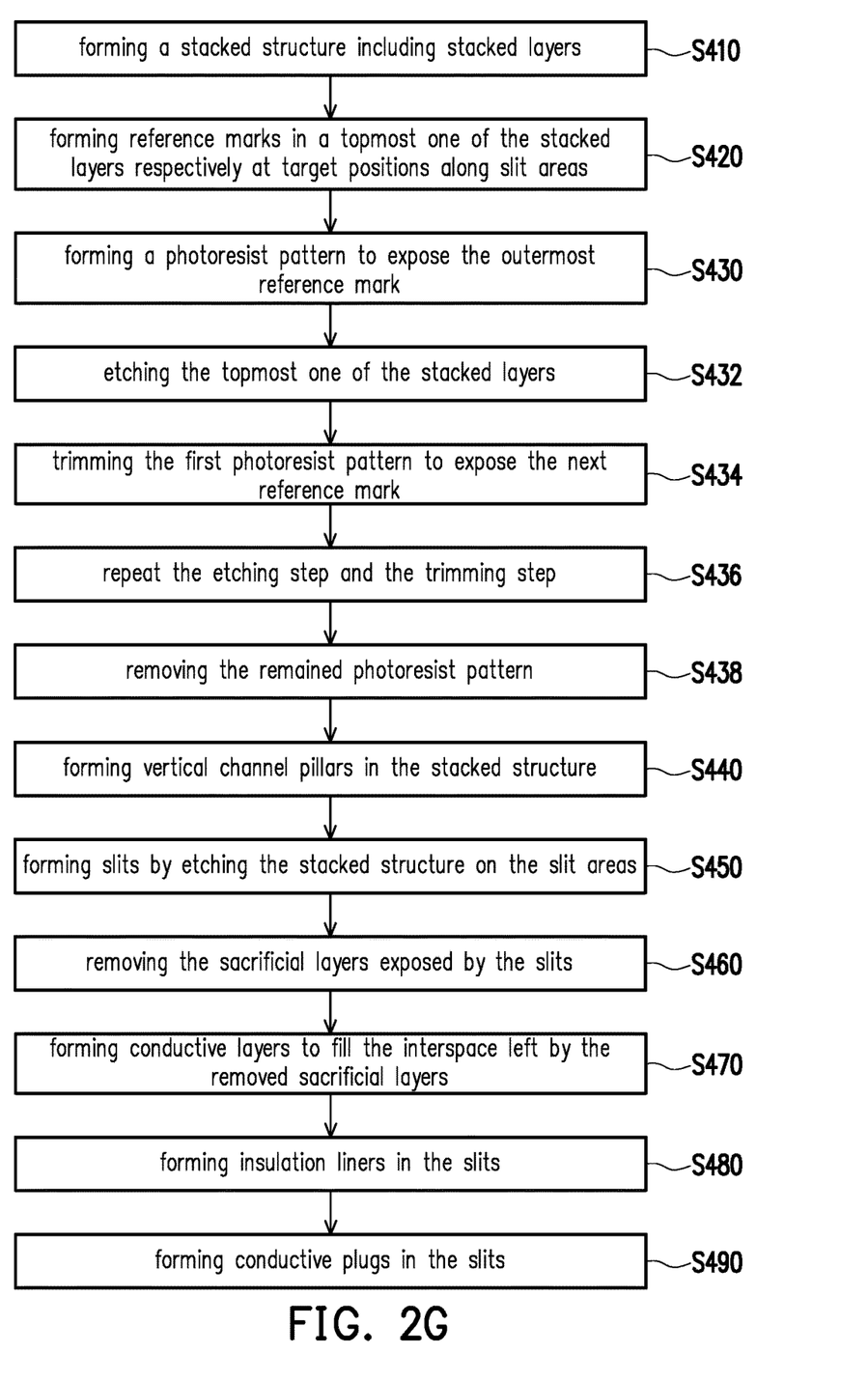
FIG. 2G is a simplified flow chart of forming a 3D memory according some embodiments of this invention.

FIG. 2G is a simplified flow chart of forming a 3D memory according an embodiment of this invention, and some brief descriptions of FIG. 2G are described below. In step 410 of FIG. 2G, a stacked structure including stacked layers having a pair of a dielectric layer (such as the dielectric layers 210 in FIG. 2A) and a sacrificial layer (such as the sacrificial layers 220 in FIG. 2A) is formed on a substrate (such as the substrate 200 in FIG. 2A) having an array area and a staircase area. The sacrificial layer is under the dielectric layer in each of the stacked layers. In step 420, reference marks (such as the reference marks 230 in FIG. 2A) are formed in a topmost one of the stacked layers (such as the dielectric layer 218 and the sacrificial layer 227 in FIG. 2A) respectively at the target positions (such as the target positions 240 in FIG. 2A) along slit areas predetermined for forming slits, and the reference marks are formed by etching a topmost one of the stacked layers. Next, a first etch-trim cycle is performed in steps 430-438.

In step 430, a first photoresist pattern (such as photoresist pattern 250a in FIG. 2A) is formed on the substrate, wherein an outermost reference mark (such as the reference mark 241 in FIG. 2A) is exposed by the first photoresist pattern. In step 432, the topmost one of the stacked layers, which are exposed by the first photoresist pattern, is etched (like in FIG. 2B). In step 434, the first photoresist pattern is trimmed by isotropically etch the first photoresist pattern to retreat the boundary of the first photoresist pattern back for a predetermined distance (like the width W1 in FIG. 2C) or expose the reference mark (such as the reference marks 232 in FIG. 2C) next to the previously exposed reference mark (such as the reference mark 231 in FIG. 2C). In step 436, the etching step 432 and the trimming step 434 are repeated for several times to form stairs, for example, until a thickness of the remained part of the first photoresist pattern is insufficient to be used in the next etching step (like in FIGS. 2D-2E). In step 438, the remained part of the first photoresist pattern is removed.

If needed, a second etch-trim cycle may be performed by starting to form a second photoresist pattern on the substrate to increase the number of the stairs in the staircase structure of the 3D memory. The steps performed in the second etch-trim cycle is similar to the steps 430-438 performed in the first etch-trim cycle, and hence are omitted from the flow chart shown in FIG. 2G. For example, like in step 430, a second photoresist pattern is formed on the substrate, and the reference mark next to the previously exposed reference mark is exposed by the second photoresist pattern. Like in step 432, the topmost one of the stacked layers, which are exposed by the second photoresist pattern, is etched. Like in step 434, the second photoresist pattern is trimmed by isotropically etch the second photoresist pattern to retreat the boundary of the second photoresist pattern back for the predetermined distance or expose the reference mark next to the previously exposed reference marks. Like in step 436, the etching step and the trimming step are repeated for several times, for example, until a thickness of a remained part of the second photoresist is insufficient to be used in the next etching step. Like in step 438, The remained part of the second photoresist pattern is then removed. After creating sufficient number of stairs in the stair structure, step 440 is performed.

In step 440, vertical channel pillars are formed in the stacked structure before forming the slits. In step 450, slits are formed by etching the stacked structure on the slit areas until the substrate is exposed. In step 460, the sacrificial layers, exposed by the slits, of the stacked structure are removed to form interspaces between adjacent layers of the dielectric layers. In step 470, conductive layers are formed in the interspaces left by the sacrificial layers, and hence the conductive layers and the dielectric layers are alternatively stacked on both sides of the slits. In step 480, insulating liners are formed respectively on the sidewalls of the slits. In step 490, conductive plugs are formed on the insulating liners to fill the slits.

Below are some examples to show the possible distributions of the reference marks above.

Figure 3A:
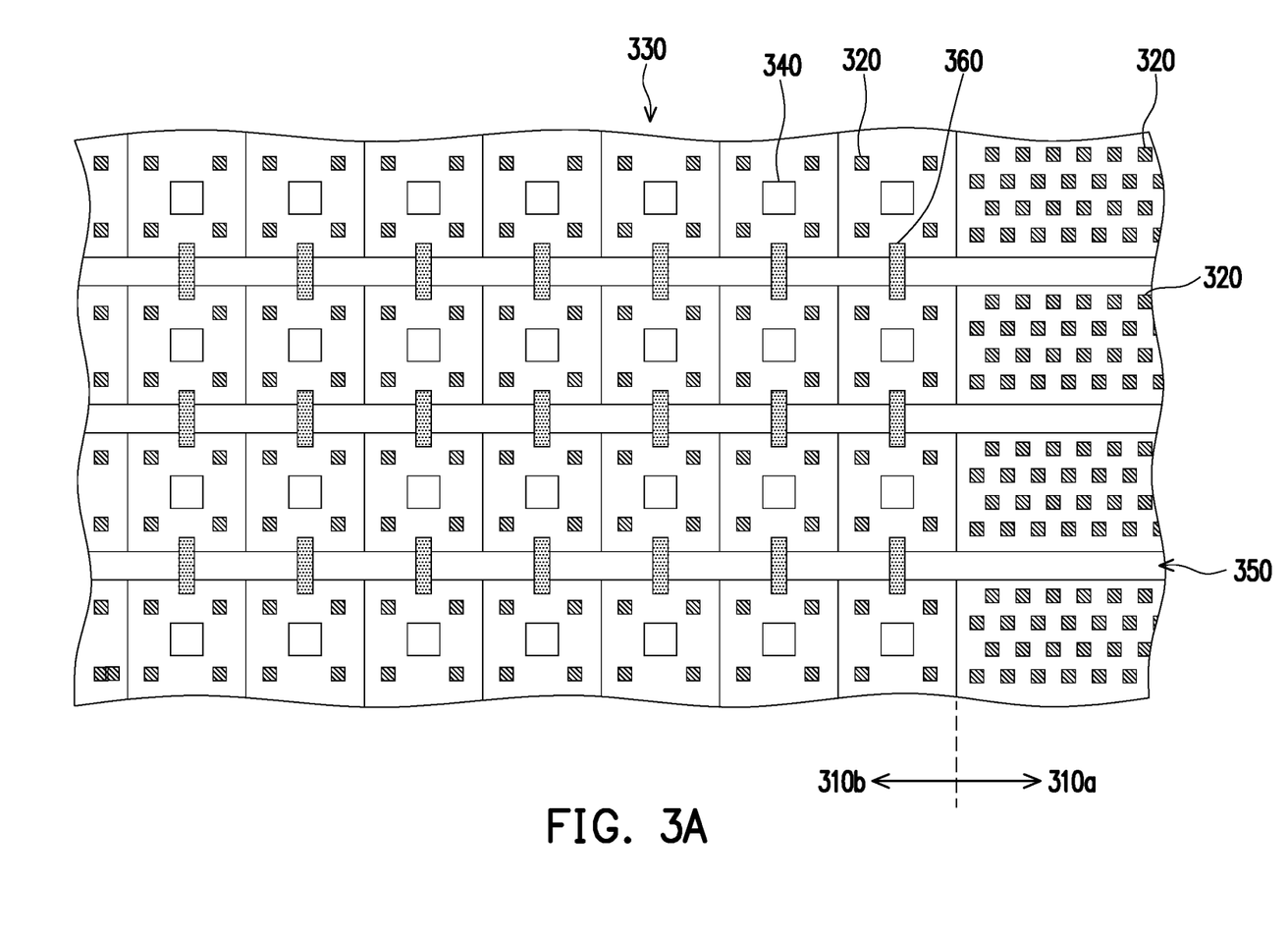
FIG. 3A is a top view showing the distributed positions of the reference marks in a layout design of a 3D memory according to a first embodiment of this invention.
Figure 3B:
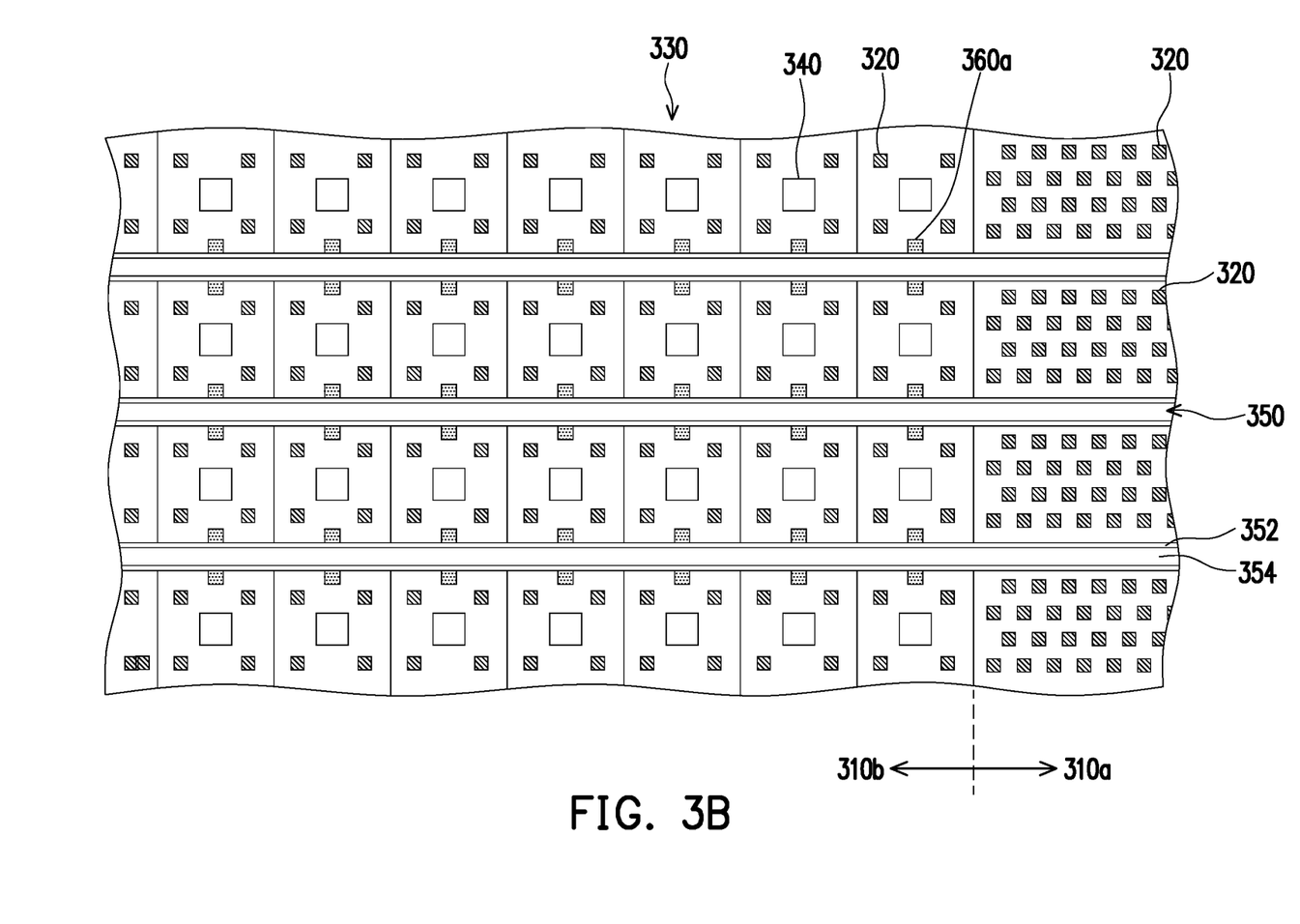
FIG. 3B is a top view showing the perspective structure of a 3D memory according to the first embodiment.

FIG. 3A is a top view showing the distributed positions of the reference marks in a layout design of a 3D memory according to a first embodiment of this invention, and FIG. 3B is a top view showing the perspective structure of a 3D memory according to the first embodiment. In the top view shown in FIG. 3A, the right side is an array area 310a, and the left side is a staircase area 310b. In the layout shown in FIG. 3A, many vertical channel pillars 320 are disposed in the array area 310a and the staircase area 310b. In the staircase area 310b, multiple stairs 330 are disposed parallel to the edge of the array area 310a. Multiple word line contacts 340 are disposed along each of the stairs 330 to electrically connect the topmost conductive layers of each stair in the staircase area 310b, respectively. In addition, multiple slits 350 are parallel disposed in the array area 310a to divide the vertical channel pillars 320 into groups and then extend to the staircase area 310b and traverse each of the stairs 330.

In the existing layout of a 3D memory described above, multiple reference marks 360 are designed to be disposed along each of the slits 350 and on each of the stairs 330. Please note that the reference marks 360 are with a direction across the slits 350. In the perspective structure shown in FIG. 3B, after the slits 350 are formed by etching the remained dielectric layers 210 and sacrificial layers 220 in FIGS. 2A-2F on slit areas used to form slits later, only portions 360a of the reference marks 360 that outside the slits 350 can be left. The left portions 360a of the reference marks 360 may be used as other marks for other process purposes. Subsequently, insulation liners 352 and conductive plugs 354 are sequentially formed in slits 350.

Figure 4A:
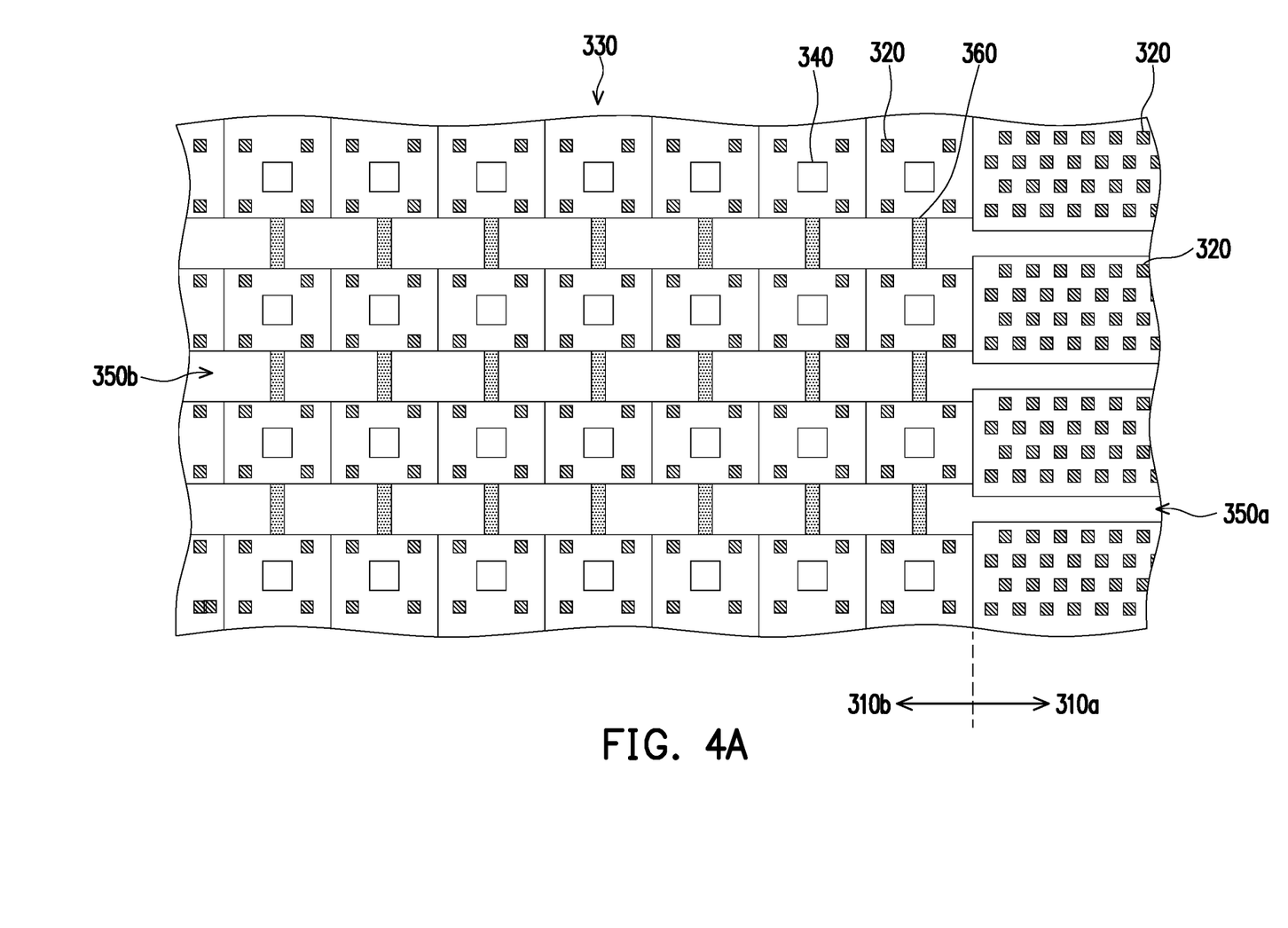
FIG. 4A is a top view showing the distributed positions of the reference marks in a layout design of a 3D memory according to a second embodiment of this invention.
Figure 4B:
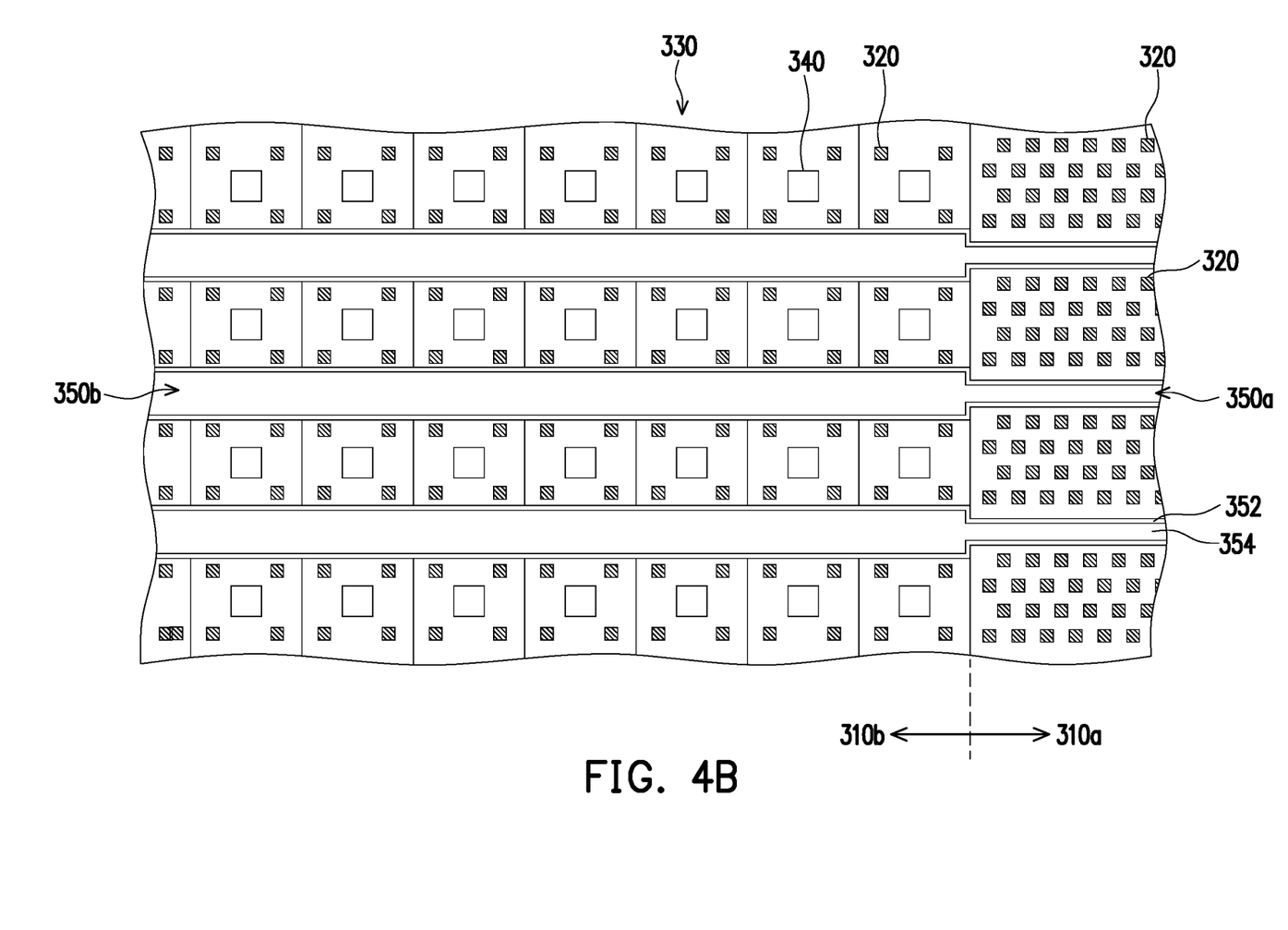
FIG. 4B is a top view showing the perspective structure of a 3D memory according to the second embodiment.

FIG. 4A is a top view showing the distributed positions of the reference marks in a layout design of a 3D memory according to a second embodiment of this invention, and FIG. 4B is a top view showing the perspective structure of a 3D memory according to the second embodiment. In FIG. 4A, the same or similar reference numbers are used for the same or similar features or elements, and the detail descriptions thereof are thus omitted here. The difference between FIG. 3A and FIG. 4A is that the slits 350a in the array area 310a and the slits 350b in the staircase area 310b have different width. The first width of the slits 350a in the array area 310a of FIG. 4A is the same as the width of the slits 350 in FIG. 3A. However, the second width of the slits 350b in the staircase area 310b of FIG. 4A is increased to cover the whole reference marks 360. That is, the first width of the slits 350a in the array area 310a is narrower than or equal to the second width of the slits 350b in the staircase area 310b. Therefore, in FIG. 4B, after the slits 350a and 350b are formed by etching the remained dielectric layers 210 and sacrificial layers 220 in FIGS. 2A-2F, the reference marks 360 are completely removed. Subsequently, insulation liners 352 and conductive plugs 354 are sequentially formed in slits 350.

Figure 5:
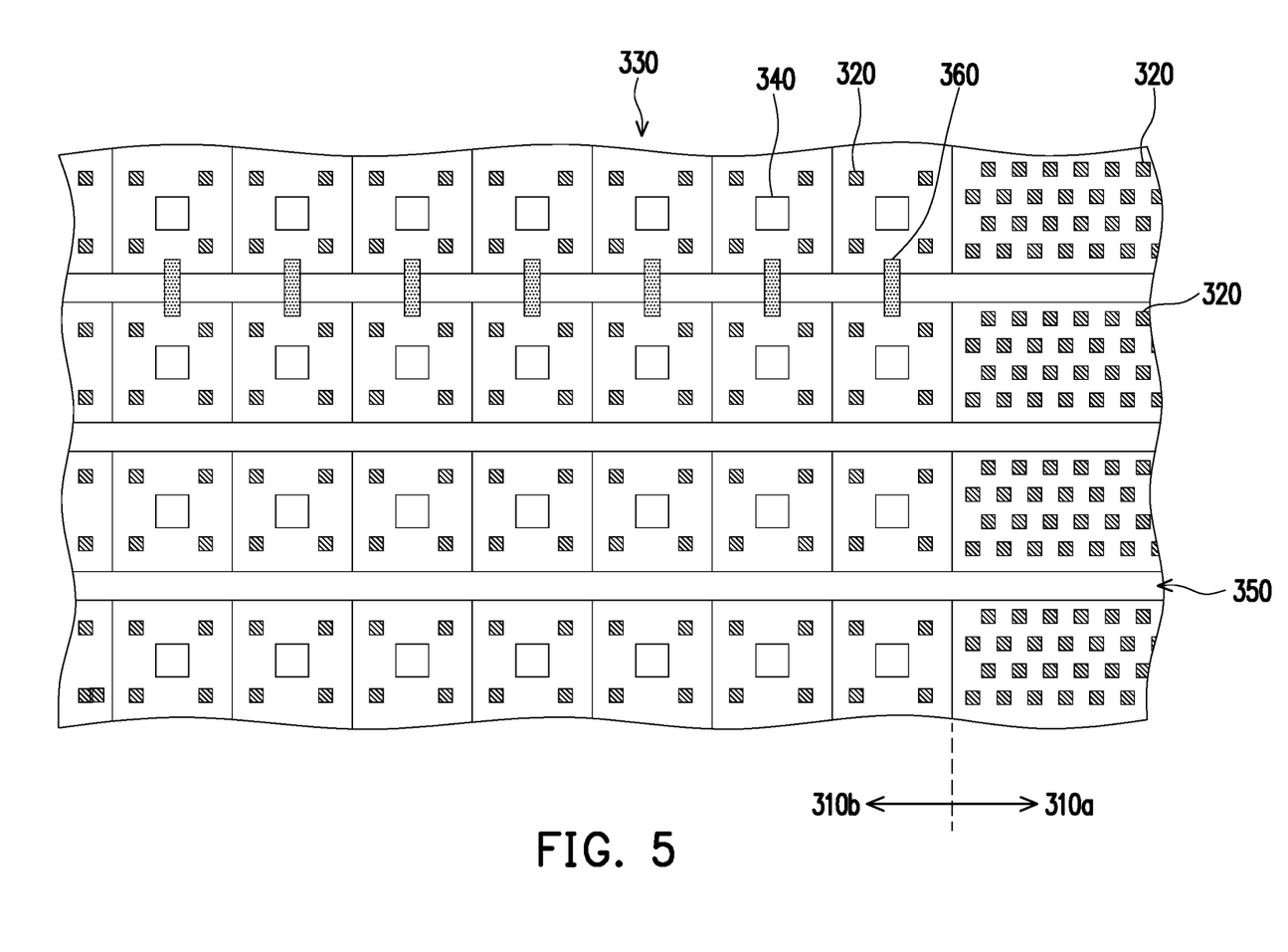
FIG. 5 is a top view showing the distributed positions of the reference marks in a layout design of a 3D memory according to a third embodiment of this invention.
Figure 6:
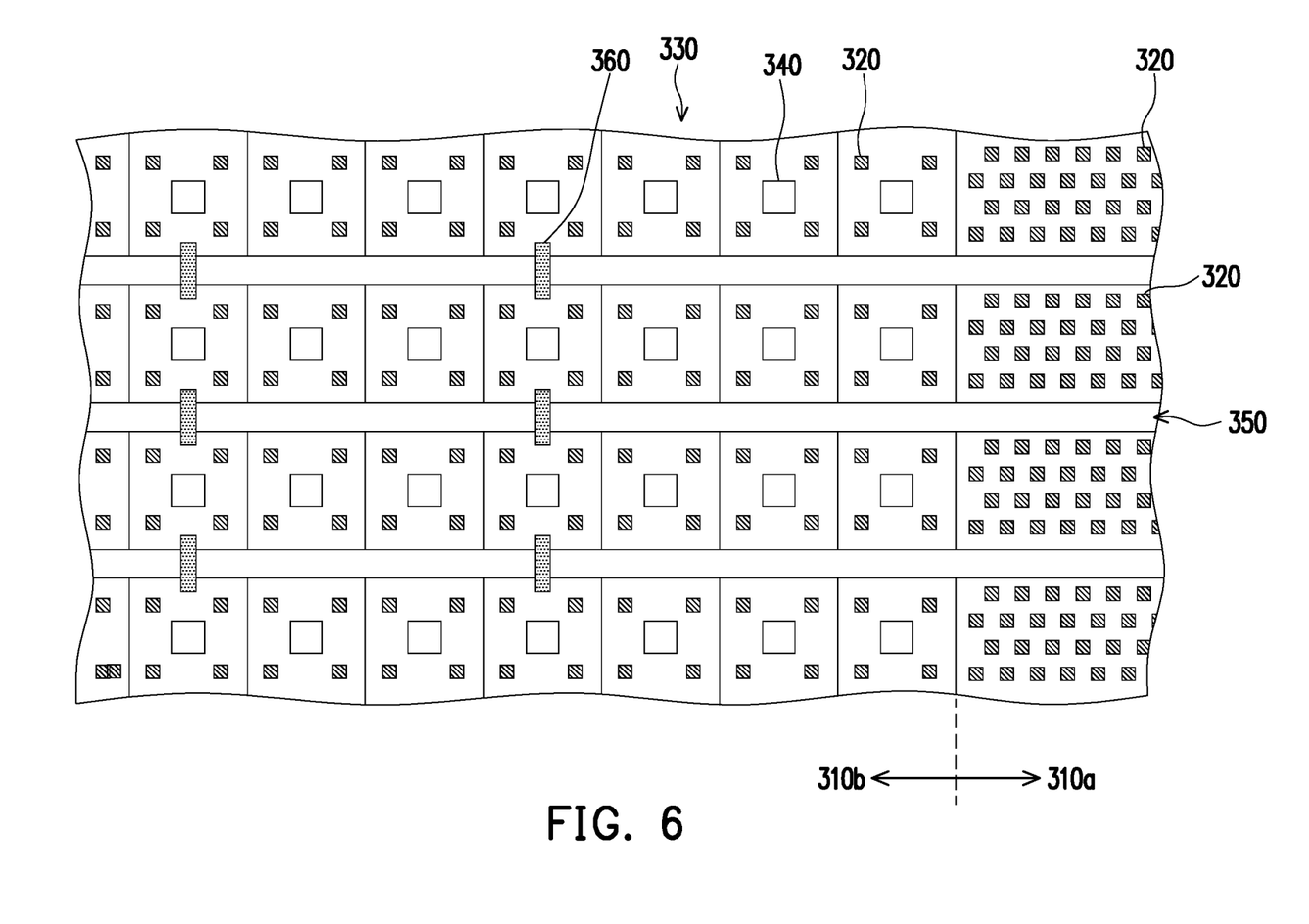
FIG. 6 is a top view showing the distributed positions of the reference marks in a layout design of a 3D memory according to a fourth embodiment of this invention.

In FIGS. 3A and 4A, the reference marks 360 are disposed on each slit 350 in FIG. 3A or each slit 350b in FIG. 4A, as well as on each stair 330 in FIGS. 3A and 4A in the staircase area 310b. In some other embodiments, the reference marks 360 may be disposed on only some of the slits 350 in FIG. 3A or some of the slits 350b in FIG. 4A, and/or only some of the stairs 330 in FIGS. 3A and 4A in the staircase area 310b. FIGS. 5-6 show some examples thereof. In FIG. 5, the reference marks 360 are disposed on only some of the slits 350. In FIG. 6, the reference marks 360 are disposed on only some of the stairs 330.

In light of the forgoing, since the reference marks are formed before the photoresist patterns with large dimensions are formed, even though only one of the opposite boundaries of the large photoresist patterns can be observed under an in-line SEM, the positions and dimensions of the large photoresist patterns still can be measured to determine any adjustments of the process parameters are needed or not.

Moreover, since the reference marks are formed on the slit areas, the width of the slits in the staircase area may be chosen to be wider or narrower than the width of the reference marks. If the width of the slits is narrower than the width of the reference marks, the reference marks can be left along at least one side of the slits to serve for any other possible purposes. If the width of the slits is wider than the width of the reference marks, the reference marks can be completely removed without a trace.

While the invention has been described by way of embodiments above, it is to be understood that the invention is not limited thereto. Anyone with ordinary skill in the art may make some changes and modifications without departing from the spirit and scope of the present invention. Therefore, the scope of the present invention shall be determined by the scope of the appended claims.

What is claimed is:

1. A semiconductor structure, comprising:
   a stacked structure including a plurality of stacked layers on a substrate having an array area and a staircase area, wherein each of the stacked layer has a pair of a dielectric layer and a conductive layer under the dielectric layer, and the stacked structure has a staircase structure on the staircase area;
   a plurality of slits disposed in the stacked structure to expose the substrate, wherein the slits across the array area and the staircase area; and
   a plurality of reference marks disposed along at least one side of the slits in the staircase structure, wherein the plurality of reference marks overlap the staircase structure.

2. The semiconductor structure of claim 1, wherein the reference marks are openings disposed in the topmost dielectric layer and the topmost conductive layer in the staircase structure.

3. The semiconductor structure of claim 1, wherein the plurality of the reference marks are disposed on each stair of the staircase structure.

4. The semiconductor structure of claim 1, wherein the plurality of the reference marks are disposed on each area between adjacent two of the slits in the staircase structure.

5. The semiconductor structure of claim 1, further comprising a plurality of vertical channel pillars disposed in the stacked structure.

6. The semiconductor structure of claim 1, further comprising a plurality of word line contacts respectively disposed on each stair to respectively connect the topmost conductive layers of the stairs.

7. The semiconductor structure of claim 1, further comprising an insulating liner on sidewalls of the slits and a conductive plug on the insulating liner in each of the slits.

8. A semiconductor structure, comprising:
   a stacked structure including a plurality of stacked layers on a substrate having an array area and a staircase area, wherein each of the stacked layer has a pair of a dielectric layer and a conductive layer under the dielectric layer, and the stacked structure has a staircase structure on the staircase area;
   a plurality of slits disposed in the stacked structure to expose the substrate, wherein the slits have a first width in the array area and have a second width in the staircase area, and the first width is narrower than the second width; and
   a plurality of reference marks disposed along at least one side of the slits in the staircase structure, wherein the plurality of reference marks overlap the staircase structure.

9. The semiconductor structure of claim 8, further comprising a plurality of vertical channel pillars disposed in the stacked structure.

10. The semiconductor structure of claim 8, further comprising a plurality of word line contacts respectively disposed on each stair to respectively connect the topmost conductive layers of the stairs.

11. The semiconductor structure of claim 8, further comprising an insulating liner on sidewalls of and a conductive plug on the insulating liner in each of the slits.

12. A method of forming a semiconductor structure, comprising:
forming a stacked structure including a plurality of stacked layers on a substrate having an array area and a staircase area, wherein each of the stacked layer has a pair of a dielectric layer and a sacrificial layer under the dielectric layer;
forming reference marks by etching a topmost one of the stacked layers respectively at target positions along slit areas predetermined for forming slits;
performing a first etch-trim cycle, which comprises:
forming a first photoresist pattern on the substrate to expose an outermost reference mark;
etching the topmost one of the stacked layers exposed by the first photoresist pattern;
trimming the first photoresist pattern to retreat the boundary of the first photoresist pattern back for a predetermined distance or expose the reference mark next to the previously exposed reference mark;
repeating the etching step and the trimming step for several times; and
removing the first remained part of the first photoresist pattern; and
forming slits by etching the stacked structure on the slit areas until the substrate is exposed.

13. The method of claim 12, wherein a width of the reference marks is larger than a width of the slits.

14. The method of claim 12, wherein the slits have a first width in the array area and a second width in the staircase area, and the first width is narrower than the second width.

15. The method of claim 12, further comprising performing a second etch-trim cycle, which comprises:
forming a second photoresist pattern on the substrate, wherein the previously exposed reference marks by the first photoresist and the reference mark next to the previously exposed reference marks are exposed by the second photoresist pattern;
etching the topmost one of the stacked layers exposed by the second photoresist pattern;
trimming the second photoresist pattern by retreat the boundary of the second photoresist pattern back for the predetermined distance or expose the reference mark next to the previously exposed reference mark;
repeat the etching step and the trimming step for several times; and
removing the second remained part of the second photoresist pattern.

16. The method of claim 12, further comprising forming a plurality of vertical channel pillars in the stacked structure before forming the slits.

17. The method of claim 12, further comprising:
removing the sacrificial layers of the stacked structure to form interspaces between adjacent layers of the dielectric layers, wherein the sacrificial layers are exposed by the slits; and
forming conductive layers in the interspaces.

18. The method of claim 17, further comprising sequentially forming insulating liners and conductive plugs respectively in the slits after forming the conductive layers.

19. The method of claim 18, further comprising forming word line contacts to connect topmost conductive layers of each stair in the staircase structure.

* * * * *